(12) United States Patent
Harada et al.

(10) Patent No.: US 7,294,203 B2
(45) Date of Patent: Nov. 13, 2007

(54) HEAT SHIELDING MEMBER OF SILICON SINGLE CRYSTAL PULLING SYSTEM

(75) Inventors: Kazuhiro Harada, Tokyo (JP); Yoji Suzuki, Tokyo (JP); Senlin Fu, Tokyo (JP); Hisashi Furuya, Tokyo (JP); Hidenobu Abe, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 55 days.

(21) Appl. No.: 10/527,566

(22) PCT Filed: Sep. 12, 2003

(86) PCT No.: PCT/JP03/11760

§ 371 (c)(1),
(2), (4) Date: Jan. 6, 2006

(87) PCT Pub. No.: WO2004/027124

PCT Pub. Date: Apr. 1, 2004

(65) Prior Publication Data

US 2006/0124052 A1    Jun. 15, 2006

(30) Foreign Application Priority Data

Sep. 18, 2002  (JP)  .............................. 2002-271240

(51) Int. Cl.
*C30B 35/00*  (2006.01)
(52) U.S. Cl. ....................... 117/217; 117/218; 117/219; 117/222

(58) Field of Classification Search ................ 117/200, 117/217, 218, 219, 222
See application file for complete search history.

(56) References Cited

U.S. PATENT DOCUMENTS 6,045,610 A    4/2000  Park et al.

(Continued)

FOREIGN PATENT DOCUMENTS

JP    57-40119    9/1983

(Continued)

*Primary Examiner*—Felisa Hiteshew
(74) *Attorney, Agent, or Firm*—Reed Smith LLP

(57) ABSTRACT

A heat shielding member is provided in a device pulling up a silicon single crystal rod from a silicon melt stored in a quartz crucible, and equipped with a tube portion which shields radiant heat from the heater surrounding the outer peripheral face of the silicon single crystal rod, a swelling portion provided at the lower portion of the tube portion, and a ring-shape heat accumulating portion provided at the inside of the swelling portion. The heat accumulating portion is a thermal conductivity of 5 W/(m·° C.) or less, its inner peripheral face is a height ($H_1$) of 10 mm or more and d/2 or less when the diameter of the silicon single crystal rod is referred to as d and the minimum distance ($W_1$) between the outer peripheral face of the silicon single crystal rod and the inner peripheral face of the heat accumulating portion is formed so as to be 10 mm or more and 0.2 d or less, a vertical distance ($H_2$) between the upper rim of the outer peripheral face and the lowest portion of the heat accumulating portion is 10 mm or more and d or less, and the minimum distance ($W_2$) between the inner peripheral face of the quartz crucible and the outer peripheral face of the heat accumulating portion is 20 mm or more and d/4 or less.

17 Claims, 7 Drawing Sheets

U.S. PATENT DOCUMENTS 6,379,460 B1 * 4/2002 Harada et al. .............. 117/217

FOREIGN PATENT DOCUMENTS

| JP | 05/-035715 | 2/1993 |
| JP | 8-325090 | 12/1996 |
| JP | 11-001393 | 6/1999 |
| JP | 2000-247776 | 9/2000 |
| JP | 2002-335993 | 12/2000 |
| JP | 2001-261494 | 9/2001 |

* cited by examiner

HEAT SHIELDING MEMBER OF SILICON SINGLE CRYSTAL PULLING SYSTEM

CROSS-REFERENCES TO RELATED APPLICATIONS

This application claims International Application PCT/JP2003/11760 filed Sep. 12, 2003 and priority of Japanese Application No. 2002-271240 filed Sep. 18, 2002, the entire disclosure of which is hereby incorporated by reference.

TECHNICAL FIELD

The invention relates to a heat shielding member provided in a device for pulling up a silicon single crystal rod to grow it.

BACKGROUND ART

As this kind of silicon single crystal pulling-up device, there has been conventionally disclosed a pulling-up device (for example, Japanese Examined Patent Application Publication No. Sho 57-40119) in which a quartz crucible in which silicon melt was amassed is stored in a chamber and a heat shielding member was inserted between the outer peripheral face of a silicon single crystal rod and the inner peripheral face of the quartz crucible so as to surround the silicon single crystal rod. The heat shielding member in the device is composed so that it surrounds the outer peripheral face of the silicon single crystal rod which is pulled up and its lower end is situated upward at an interval from the surface of the silicon melt, it has a tube portion which shields radiant heat from a heater, and the heat shielding member introduces smoothly inactive gas which flows down between the outer peripheral face of the silicon single crystal rod and the inner peripheral face of the tube portion. In the pulling-up device, it is prevented by shielding radiant heat from the inner peripheral wall of a quartz crucible exposed that radiant heat reaches at the outer peripheral face of the silicon single crystal rod; therefore the solidification of the silicon single crystal rod under pulling-up is accelerated and the silicon single crystal rod is designed to be speedily cooled.

Further, as this kind of silicon single crystal pulling-up device, there is disclosed a device in which a tube portion is formed as a multilayer structure having a mother member such as graphite which has heat resistance at a temperature range of the radiant heat and a covering material such as quartz which covers the face at the silicon single crystal rod side of the mother member and has a smaller radiation coefficient than that of the mother member (for example, Japanese Patent Laid-Open Publication No. Hei 08-325090). Since the mother member having a larger radiation coefficient was covered with a covering member having a smaller radiation coefficient than that of the mother member in the heat shielding member thus composed, the shielding effect of the radiant heat of a crucible and a heater to the silicon single crystal rod can be improved. As a result, the pulling-up speed of the silicon single crystal rod by acceleration of cooling can be increased and the productivity of the silicon single crystal rod can be improved.

On the other hand, as causes for lowering an yield in steps of producing a semiconductor integrated circuit, there are mentioned the fine faults of an oxygen precipitate being the nuclei of an oxidation-induced Stacking fault (Oxidation-induced Stacking Fault (hereinafter, referred to as OSF)), a particle originated in crystal (Crystal Originated Particle (hereinafter, referred to as COP)) or the existence of invasive type dislocation (Interstitial-type Large Dislocation (hereinafter, referred to as L/D)). OSF is the cause of trouble such as the increase of leak current of a device which is prepared by introducing fine faults being the nuclei during crystal growth and actualizing them in the thermal oxidation step and the like when a semiconductor device is produced. Further, the COP is a pit originated in a crystal which appears on the surface of a wafer when a silicon wafer after mirror polishing was rinsed with a mix solution of ammonia and hydrogen peroxide. When the wafer is measured with a particle counter, the pit is also detected as an optically scattered fault together with a natural particle.

The COP becomes a cause for deteriorating, for example, the aging property of insulation breakage of an oxidized film (Time Dependent dielectric Breakdown, TDDB), the property of pressure resistance of an oxidized film (Time Zero Dielectric Breakdown, TZDB) and the like. Further, when the COP exists on the surface of a wafer, level difference is generated at the wiring step of a device and may be possibly a cause for disconnection. Further, it is also a cause for leak and the like at an element separation portion and the yield of a product is lowered. Further, the L/D is also called as a dislocation cluster, or is also called as a dislocation pit because a pit is generated when the silicon wafer which generated the fault is immersed in a selective etching solution in which hydrofluoric acid is a main component. The L/D is also a cause for deteriorating electrical properties, for example, leak property, isolation property and the like. As a result, it is required that the OSF, COP and L/D are reduced from a silicon wafer which is used for production of a semiconductor integrated circuit.

The production processes of a silicon single crystal rod based on the Voronkov theory are disclosed in order to cut out silicon wafers without faults having not the OSF, COP and L/D (for example, U.S. Pat. No. 6,045,610 and Japanese Published Patent Application No. Hei 11-1393). In the Voronkov theory, when the silicon single crystal rod is pulled up at a high speed, a zone [V] in which the agglomerate of hole-type point faults exists predominantly is formed in the inside of the silicon single crystal rod, and when the silicon single crystal rod is pulled up at a low speed, a zone [I] in which the agglomerate of interstitial silicon-type point faults exists predominantly is formed in the inside of the silicon single crystal rod. Accordingly, the above-mentioned production process can produce a silicon single crystal rod comprising a perfect zone [P] in which the agglomerate of the point faults does not exist, by nearly homogenizing the distribution of temperature gradient to a diameter direction in the axial direction of the silicon single crystal rod by pulling up the silicon single crystal rod at an optimum speed.

However, since the quantity of radiant heat from the outer peripheral face of the silicon single crystal rod which is pulled up from silicon melt is much in the heat shielding member in the silicon single crystal pulling-up device shown in Japanese Published Patent Application No. Hei 08-325090, the temperature gradient to an axis direction at the outer peripheral portion of the silicon single crystal rod is higher in comparison with the temperature gradient to an axis direction at the center of the silicon single crystal rod and there is a problem that the distribution of temperature gradient to a diameter direction in the axial direction of the silicon single crystal rod cannot be homogenized. In particular, when the enlargement of the diameter of the silicon single crystal rod proceeds, it is anticipated that the difference of the temperature gradient to an axis direction between the central portion and the outer peripheral portion of the above-mentioned silicon single crystal rod is further enlarged. Consequently, there has been a fear that thermal stress based on the above-mentioned difference is generated in the silicon single crystal rod and the silicon single crystal rod without faults cannot be obtained.

It is the object of the present invention to provide the heat shielding member of a silicon single crystal pulling-up device which obtains a silicon single crystal rod without faults by contracting the difference of the temperature gradient to an axis direction between the central portion and the outer peripheral portion of the silicon single crystal rod by intercepting the abrupt lowering of temperature of the outer peripheral face of the lower portion of the silicon single crystal rod under pulling-up from a silicon melt.

DISCLOSURE OF INVENTION

As shown in FIG. 2, the invention related to claim 1 is the improvement of a heat shielding member which is provided in a device which pulls up a silicon single crystal rod 25 from a silicon melt 12 which was stored in a quartz crucible 13 which is heated by a heater 18 surrounding the outer peripheral face of the quartz crucible 13, and equipped with a tube portion 37 whose lower end is situated upward at an interval from the surface of the silicon melt 12 and which shields radiant heat from a heater 18 surrounding the outer peripheral face of the silicon single crystal rod 25, a swelling portion 41 which is provided at the lower portion of the tube portion 37 by being swollen to a tube direction, and a ring-shape heat accumulating portion 47 which is provided at the inside of the swelling portion 41 and surrounds the outer peripheral face of the lower portion of the silicon single crystal rod 25.

As shown in FIG. 1, its characteristic composition is formed so that the heat accumulating portion 47 is a thermal conductivity of 5 W/(m·° C.) or less, the heat accumulating portion 47 has an inner peripheral face which is in parallel to the axial line of the silicon single crystal rod 25, or is slanted at an angle of −30 degrees or more and +30 degrees or less, d is 100 mm or more when the diameter of the silicon single crystal rod 25 is referred to as d, the inner peripheral face of the heat accumulating portion 47 is a height $H_1$ of 10 mm or more and d/2 or less, and the minimum distance $W_1$ between the outer peripheral face of the silicon single crystal rod 25 and the inner peripheral face of the heat accumulating portion 47 is 10 mm or more and 0.2 d or less.

In the heat shielding member of the silicon single crystal pulling-up device described in claim 1, the surrounding of the silicon single crystal rod 25 nearby the silicon melt at the lower side from the swelling portion 41 is positively heated by a heater 18 and the silicon melt 12 at high temperature. On the other hand, the heat accumulating portion 47 provided at the inside of the swelling portion 41 is also positively heated by the heater 18 and the silicon melt 12 at high temperature and the surrounding of the silicon single crystal rod 25 facing the swelling portion 41 is heated by the heat accumulating portion 47 heated. Thereby, the abrupt lowering of temperature at the outer peripheral portion of the lower portion of the silicon single crystal rod 25 is intercepted and the distribution of temperature gradient to a diameter direction in the axial direction of the silicon single crystal rod 25 at this portion is nearly homogenized; therefore the silicon single crystal rod 25 without faults can be produced by the V/G model of Voronkov.

On the other hand, at the inside of the tube portion 37 at the upper side from the swelling portion 41, the radiant heat from the silicon melt 12 at high temperature is shielded by the heat accumulating portion 47 which is provided at the inside of the swelling portion 41, and the radiant heat from the heater 18 is also shielded by the tube portion 37. Consequently, the radiant heat from the silicon single crystal rod 25 which is situated at the upper side from the swelling portion 41 is accelerated in comparison with the lower portion of the above-mentioned silicon single crystal rod 25.

Herein, when the thermal conductivity of the heat accumulating portion 47 exceeds 5 W/(m·° C.), or the height $H_1$ at the inner peripheral face of the heat accumulating portion 47 is less than 10 mm, or the minimum distance $W_1$ between the outer peripheral face of the silicon single crystal rod 25 and the inner peripheral face of the heat accumulating portion 47 exceeds 0.2 d, the radiant heat from the silicon melt 12 cannot be adequately intercepted. The preferable thermal conductivity of the heat accumulating portion 47 is 1 W/(m·° C.) or less. Further, when the height $H_1$ at the inner peripheral face of the heat accumulating portion 47 exceeds d/2, the swelling portion 41 which stores the heat accumulating portion 47 is largely sized and it is difficult to accelerate the radiant heat from the silicon single crystal rod 25 which is situated at the upper side from the swelling portion 41. Further, when the minimum distance $W_1$ between the outer peripheral face of the silicon single crystal rod 25 and the inner peripheral face of the heat accumulating portion 47 is less than 10 mm, there is a fear that the swelling portion 41 which stores the heat accumulating portion 47 is brought in contact with the silicon single crystal rod 25 which is under pulling-up.

The invention related to claim 2 is the invention related to claim 1 and the heat shielding member of a silicon single crystal pulling-up device in which the heat accumulating portion 47 has an outer peripheral face which is in parallel to the axial line of the silicon single crystal rod 25, or is slanted at an angle of −30 degrees or more and +30 degrees or less, a vertical distance $H_2$ between the upper rim of the outer peripheral face and the lowest portion of the heat accumulating portion 47 is 10 mm or more and d or less, and the minimum distance $W_2$ between the inner peripheral face of the quartz crucible 13 and the outer peripheral face of the heat accumulating portion 47 is 20 mm or more and d/4 or less.

In the heat shielding member of a silicon single crystal pulling-up device according to claim 2, since the lower face and the outer peripheral face of the heat accumulating portion 47 receives the radiant heat from the silicon melt 12 or the quartz crucible 13 and the temperature of the heat accumulating portion 47 itself is raised, the abrupt lowering of temperature at the outer peripheral portion of the silicon single crystal rod 25 nearby the solid-liquid interface of the silicon single crystal rod 25 can be intercepted. Herein, when the height $H_2$ at the outer peripheral face of the heat accumulating portion 47 is less than 10 mm, the radiant heat cannot be adequately intercepted and when it exceeds the diameter d of the silicon single crystal rod 25, the swelling portion 41 which stores the heat accumulating portion 47 is largely sized. Further, when the minimum distance $W_2$ between the inner peripheral face of the quartz crucible 13 and the outer peripheral face of the heat accumulating portion 47 is less than 20 mm, there is a fear that the heat shielding member 36 is brought in contact with the quartz crucible 13 and when it exceeds 0.25d, it is difficult to adequately intercept the heat.

Herein, it is preferable that the heat accumulating portion 47 has an upper face whose diameter is largely formed at an angle δ exceeding zero degree and being 80 degrees or less against the upper face which is horizontally formed or a horizontal plane in accordance with facing upward. Since it has the horizontal or slanted upper face, inactive gas which flows down between the outer peripheral face of the silicon single crystal rod 25 and the inner peripheral face of the tube portion 37 is smoothly introduced between the silicon melt 12 and the swelling portion 41.

On the other hand, it is preferable that the bottom face of the heat accumulating portion 47 is a horizontal plane as shown in FIG. 1 in order to promote to accumulate the radiant heat from the silicon melt 12 in the heat accumulating portion 47, or is formed so that its diameter is lessened at an angle (α or θ) exceeding zero degree and being 80 degrees or less against a plane in accordance with facing downward or upward as shown in FIGS. 9 and 10.

Further, as shown in FIG. 1, when the tube portion 37 is the heat shielding member of a silicon single crystal pulling-up device which has an inner tube member 37a, an outer tube member 37b and an adiabatic material 37c which is filled or intervened between the inner tube member 37a and the outer tube member 37b, the radiant heat from the heater 18 and the inner peripheral wall of the quartz crucible 13 to the silicon single crystal rod 25 can be effectively shielded and the cooling of the silicon single crystal rod 25 pulled up over the swelling portion 41 can be promoted. In this case, it is preferable that the inner diameter $D_1$ of the adiabatic material 37c is 2d or more and the thickness t of the adiabatic material 37c is 5 mm or more and when the thickness of the inner tube member 37a is n, it is further preferable that the inner diameter $D_2$ of the inner tube member 37a is (2d−2n) or more. The heat shielding member of a silicon single crystal pulling-up device can not only surely shield the radiant heat from the heater 18 and the inner peripheral wall of the quartz crucible 13 to the silicon single crystal rod 25, but also the farther the tube portion 37 is separated from the crystal 25, the more the cooling of a crystal 25 at the upper side from the swelling portion 41 can be promoted.

BEST MODE FOR CARRYING OUT THE INVENTION

Then, the first embodiment of the present invention is illustrated as follow based on the drawings.

Figure 2:
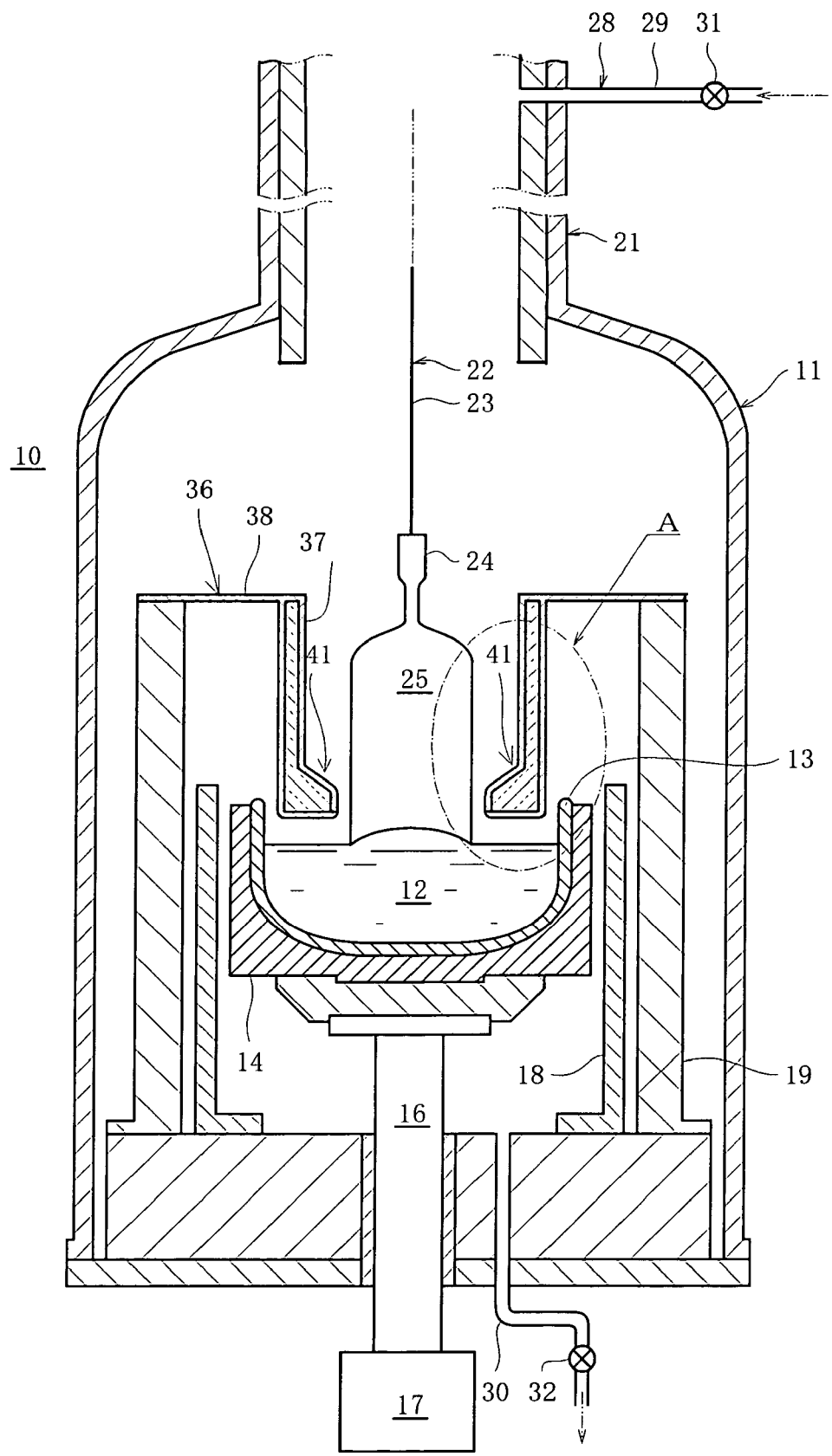
FIG. 2 is a sectional composition view of its silicon single crystal pulling-up device.

As shown in FIG. 2, the quartz crucible 13 which stores the silicon melt 12 is provided in the chamber 12 of a silicon single crystal pulling-up device 10 and the outer peripheral face of the quartz crucible 13 is covered with a graphite susceptor 14. The lower face of the quartz crucible 13 is fixed on the upper end of a supporting axis 16 through the above-mentioned graphite susceptor 14 and the lower portion of the supporting axis 16 is connected with a crucible driving means 17. The crucible driving means 17 has the first motor for rotation not illustrated which rotates the quartz crucible 13 and the second motor for elevation which elevates the quartz crucible 13 which are not illustrated, and the quartz crucible 13 can be rotated to a fixed direction by these motors and can be moved to an up and down direction. The outer peripheral face of the quartz crucible 13 is surrounded by the heater 18 at a fixed interval and the heater 18 is surrounded by a heat insulation tube 19. The heater 18 heats and melts a silicon polycrystal with high purity charged in the quartz crucible 13 to prepare the silicon melt 12.

Further, a columnar casing 21 is connected with the upper end of the chamber 11. A pulling-up means 22 is provided at the casing 21. The pulling-up means 22 has a pulling-up head (not illustrated) which is provided to be able to be rotated in a horizontal condition at the upper end portion of the casing portion 21, the second motor for rotation (not illustrated) which rotates the head, a wire cable 23 which is hung from the head to the rotational center of the quartz crucible 13, and a motor (not illustrated) for winding or pulling up the wire cable 23 which is provided in the above-mentioned head. A seed crystal 24 which is immersed in the silicon melt 12 and pulls up the silicon single crystal rod 25 is provided at the lower end of the wire cable 23.

Further, a gas feeding and discharging means 28 which feeds inactive gas to the silicon single crystal rod side of the chamber 11 and discharges the above-mentioned inactive gas from the inner peripheral face side of the crucible of the chamber 11 is connected with the chamber 11. One end of the gas feeding and discharging means 28 is connected with the peripheral wall of the casing 21 and another end has a feeding pipe 29 which is connected with a tank (not illustrated) storing the inactive gas and a discharged pipe 30 whose one end is connected with the lower wall of the chamber 11 and another end is connected with a vacuum pump (not illustrated). The first and second flow rate adjusting valves 31 and 32 which adjust the flow rate of the inactive gas which flows in these pipes 29 and 30 are respectively provided at the feeding pipe 29 and the discharged pipe 30.

On the other hand, an encoder (not illustrated) is provided at the output axis (not illustrated) of the motor for pulling-up and an encoder (not illustrated) which detects the elevation position of the supporting axis 16 is provided at the crucible driving means 17. The respective detection outputs of two encoders are connected with the control inputs of a controller (not illustrated) and the control outputs of the controller are respectively connected with the motor for pulling-up of the pulling-up means 22 and the motor for elevation of the crucible driving means. Further, a memory (not illustrated) is provided at the controller and the winding length of the wire cable 23 against the detection output of the encoder, namely the pulling-up length of the silicon single crystal rod 25 is memorized in the memory as the first map. Further, the liquid face level of the silicon melt 12 in the quartz crucible 13 against the pulling-up length of the silicon single crystal rod 25 is memorized in the memory as the second map. The controller is composed to control the motor for elevation of the crucible driving means 17 so that the liquid face of the silicon melt 12 in the quartz crucible 13 is always kept at a fixed level based on the detection output of the encoder in the motor for pulling-up.

Figure 1:
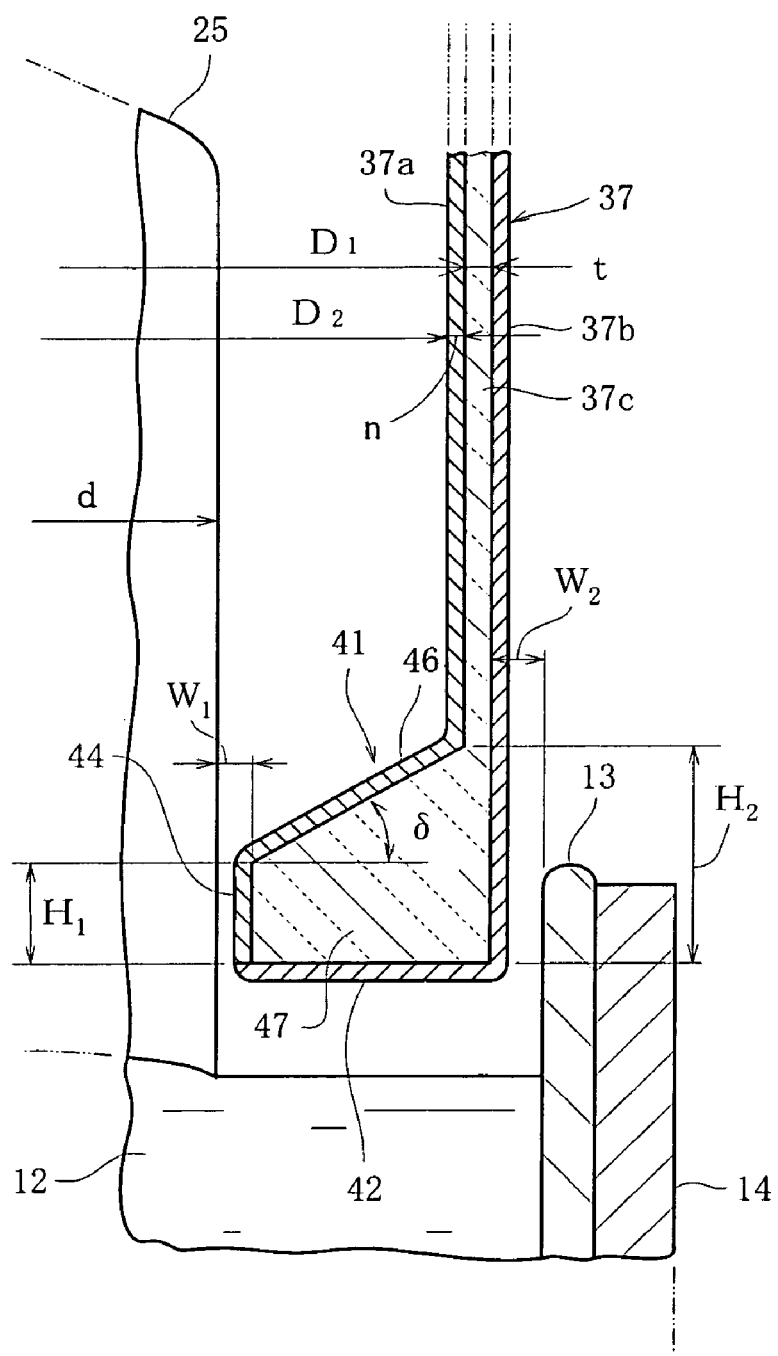
FIG. 1 is a magnified sectional view of the A portion of FIG. 2 showing the heat shielding member of the silicon single crystal pulling-up device of the present invention.

The heat shielding member 36 which surrounds the outer peripheral face of the silicon single crystal rod 25 is provided between the outer peripheral face of the silicon single crystal rod 25 and the quartz crucible 13. The heat shielding member 36 has the tube portion 37 which shields the radiant heat from the heater 18 which is formed in a columnar shape and a flange portion 38 which is provided in linking at the upper rim of the tube portion 37 and projected outward nearly to a horizontal direction. The heat shielding member 36 is fixed in the chamber 11 so that the lower rim of the tube portion 37 is situated upward by a fixed distance from the surface of the silicon melt 12, by mounting the above-mentioned flange portion 38 on the heat insulation tube 19. As shown in FIG. 1, the tube portion 37 has the inner tube member 37a, the outer tube member 37b and the adiabatic material 37c which is filled or intervened between the inner tube member 37a and the outer tube member 37b. The tube portion 37 in the embodiment is a tube body with the same diameter and the adiabatic material 37c consists of a felt material which comprises a carbon fiber. Further, when the diameter of the silicon single crystal rod 25 is referred to as d, the inner diameter $D_1$ of the adiabatic material 37c is 2d or more when d is 100 mm or more, and its outer diameter is determined within a scope that the outer tube member 37b is not brought in contact with the inner face of the quartz crucible 13. The thickness t of the adiabatic material 37c is formed so as to be 5 mm or more and when the thickness of the inner tube member 37a is referred to as n, the inner diameter $D_2$ of the inner tube member 37a is (2d−2n) or more. Then, the swelling portion 41 which is projected by swelling to a direction in the tube is provided at the lower portion of the tube portion 37.

The swelling portion 41 is composed of a ring shaped bottom wall 42 which is connected with the lower rim of the tube portion 37, extended horizontally and reaches nearby the outer peripheral face of the silicon single crystal rod 25, a vertical wall 44 which is provided in linking with the inner rim of the bottom wall 42, and an upper wall 46 which is provided in linking with the upper rim of the vertical wall 44. In this embodiment, the outer tube member 37b in the tube portion 37 and the bottom wall 42 are integrally formed and the inner tube member 37a in the tube portion 37, the upper wall 46 and the vertical wall 44 are integrally formed. It is preferable that the inner tube member 37a, the outer tube member 37b, the bottom wall 42, the vertical wall 44 and the upper wall 46 are prepared with graphite which is thermally stable and highly pure, or graphite on whose surface is coated with SiC, but materials such as Mo (molybdenum) and W (tungsten) which are thermally stable can be used.

The diameter of the upper wall 46 is formed horizontally, or so as to be enlarged in accordance with facing upward and the upper rim is composed so as to be continued to the inner tube member 37a in the tube portion 37. Further, a ring shaped heat accumulating member 47 is provided at the lower portion of the outer tube member 37b being the lower portion of the tube portion 37 and at the inside of the swelling portion 41 which is surrounded by the bottom wall 42, the vertical wall 44 and the upper wall 46. The heat accumulating member 47 in the embodiment is formed by filling a felt material with 0.05 to 0.50 g/cm³ which comprises a carbon fiber, in the inside of the swelling portion 41. The thermal conductivity of the heat accumulating member 47 is limited to be 5 W/(m·° C.) or less by using the carbon fiber as the heat accumulating member 47. However, the heat accumulating member 47 is not limited to the felt material which comprises the carbon fiber and an adiabatic material such as alumina can be also used so far as the thermal conductivity is 5 W/(m·° C.) or less.

The heat accumulating portion 47 which is provided at the inside of the swelling portion 41 is formed so that an inner peripheral face which is in parallel to the axial line of the silicon single crystal rod 25, or is slanted at an angle of −30 degrees or more and +30 degrees or less is formed by the vertical wall 44 forming the swelling portion 41, the height $H_1$ of the inner peripheral face of the heat accumulating portion 47 is 10 mm or more and d/2 or less when the diameter of the silicon single crystal rod 25 is referred to as d, and the minimum distance $W_1$ with the outer peripheral face of the silicon single crystal rod 25 is 10 mm or more and 0.2 d or less. Herein, −30 degrees represents that the diameter is formed so as to be small at an angle of 30 degrees against the axial line of the silicon single crystal rod 25 in accordance with facing upward, and +30 degrees represents that the diameter is formed so as to be large at an angle of −30 degrees against the axial line of the silicon single crystal rod 25 in accordance with facing upward, but it is preferably in parallel to the axial line of the silicon single crystal rod 25, namely it is preferable that the inner peripheral face of the heat accumulating member 47 is formed so as to be perpendicular.

On the other hand, since the upper wall 46 which composes the swelling portion 41 is formed in parallel or so that the diameter is large in accordance with facing upward, the heat accumulating portion 47 has an upper face whose diameter is largely formed at an angle δ exceeding zero degree and being 80 degrees or less against the upper face which is horizontally formed or a horizontal plane in accordance with facing upward, and in the heat accumulating portion 47, an outer peripheral face which is in parallel to the axial line of the silicon single crystal rod 25, or is slanted at an angle of −30 degrees or more and +30 degrees or less is formed. Further, since the bottom wall 42 is horizontally extended to be formed, the heat accumulating member 47 has a bottom face which is horizontally formed and the respective lower rims of the inner peripheral face and the outer peripheral face of the heat accumulating member 47 are the same perpendicular position. It is formed so that the vertical distance $H_2$ between the upper rim of the outer peripheral face and the lowest portion of the heat accumulating portion 47 is 10 mm or more and d or less, and the minimum distance $W_2$ with the inner peripheral face of the quartz crucible 13 is 20 mm or more and d/4 or less. Further, the preferable value of the distance $W_1$ in case of pulling up the axial line of the silicon single crystal rod 25 with a diameter d of 200 mm is 15 to 35 mm and the preferable value of the distance $W_2$ is 20 to 40 mm.

The motion of the silicon single crystal pulling-up device thus composed is illustrated.

In the heat shielding member of a conventional silicon single crystal pulling-up device, when the silicon single crystal rod 25 is pulled up at a fixed speed from the silicon melt 12, the quantity of radiant heat from the outer peripheral face nearby the silicon melt 12 of the silicon single crystal rod 25 is much; therefore the temperature gradient to an axis direction at the outer peripheral portion of the silicon single crystal rod is higher in comparison with the temperature gradient to an axis direction at the center of the silicon single crystal rod.

However, in the heat shielding member 36 of the silicon single crystal pulling-up device of the present embodiment, the surrounding of the silicon single crystal rod 25 nearby the silicon melt at the lower side than the swelling portion 41 is positively heated by the heater 18 and the silicon melt 12 at high temperature. On the other hand, the heat accumulating member 47 which is provided at the inside of the swelling portion 41 is also positively heated by the heater 18 and the silicon melt 12 at high temperature and the surrounding of the silicon single crystal rod 25 facing the swelling portion 41 is heated by the heat accumulating member 47 heated. Thereby, the abrupt lowering of temperature at the outer peripheral portion of the lower portion of the silicon single crystal rod 25 is intercepted and the distribution of temperature gradient to a diameter direction in the axial direction of the silicon single crystal rod 25 at this portion is nearly homogenized; therefore the silicon single crystal rod 25 without faults can be produced by the V/G model of Voronkov. On the other hand, at the inside of the tube portion 37 at the upper side from the swelling portion 41, the radiant heat from the heater 18 is shielded by the tube portion 37 and the radiant heat from the silicon melt 12 at high temperature is also shielded by the heat accumulating portion 47 which is provided at the inside of the swelling portion 41. Consequently, the radiant heat from the silicon single crystal rod 25 which is situated at the upper side than the swelling portion 41 is accelerated in comparison with the lower portion of the above-mentioned silicon single crystal rod 25.

Figure 3:
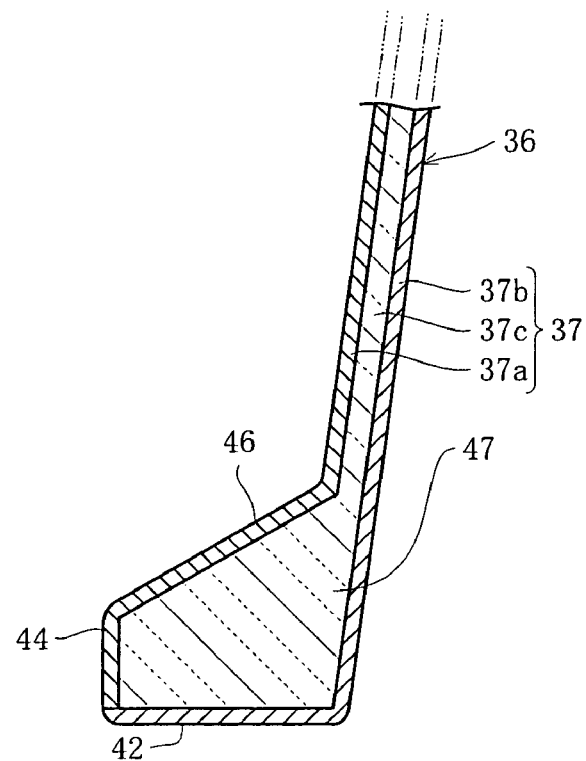
FIG. 3 is a sectional view showing the heat shielding member in which the diameter of a tube portion is formed so as to be small downward.

Further, in the above-mentioned embodiment, the tube portion 37 of the heat shielding member is formed in a columnar shape, but as shown in FIG. 3, it may be also formed in a hollow truncated cone shape. When the diameter of the tube portion 37 is formed so as to be lessened in accordance with facing downward, inactive gas which flows down between the tube portion 37 and the outer peripheral face of the silicon single crystal rod 25 can be smoothly introduced between the silicon melt 12 and the swelling portion 41.

Figure 4:
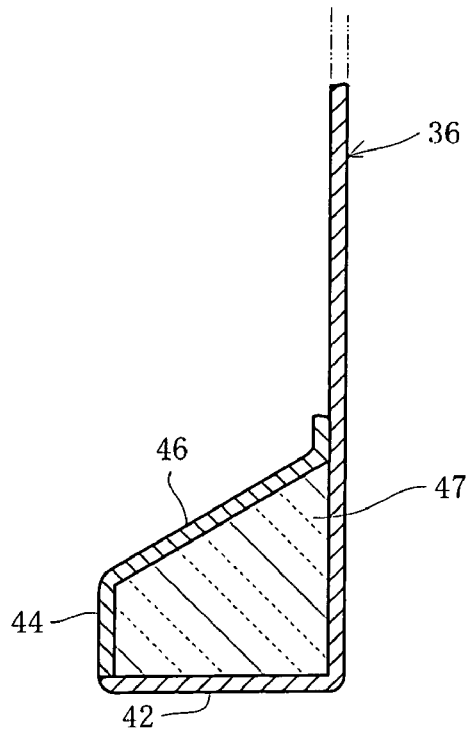
FIG. 4 is a sectional view showing the heat shielding member which has a tube portion in which an adiabatic material is not filled.

Further, in the above-mentioned embodiment, the tube portion 37 in which the adiabatic material 37c is filled between the inner tube member 37a and the outer tube member 37b is shown, but as shown in FIG. 4, the tube portion 37 in which the adiabatic material is not filled may be good so far as the height $H_1$ of the inner peripheral face of the heat accumulating portion 47 is 10 mm or more and d/2 or less and the minimum distance $W_1$ with the outer peripheral face of the silicon single crystal rod 25 is 10 mm or more and 0.2 d or less.

Figure 5:
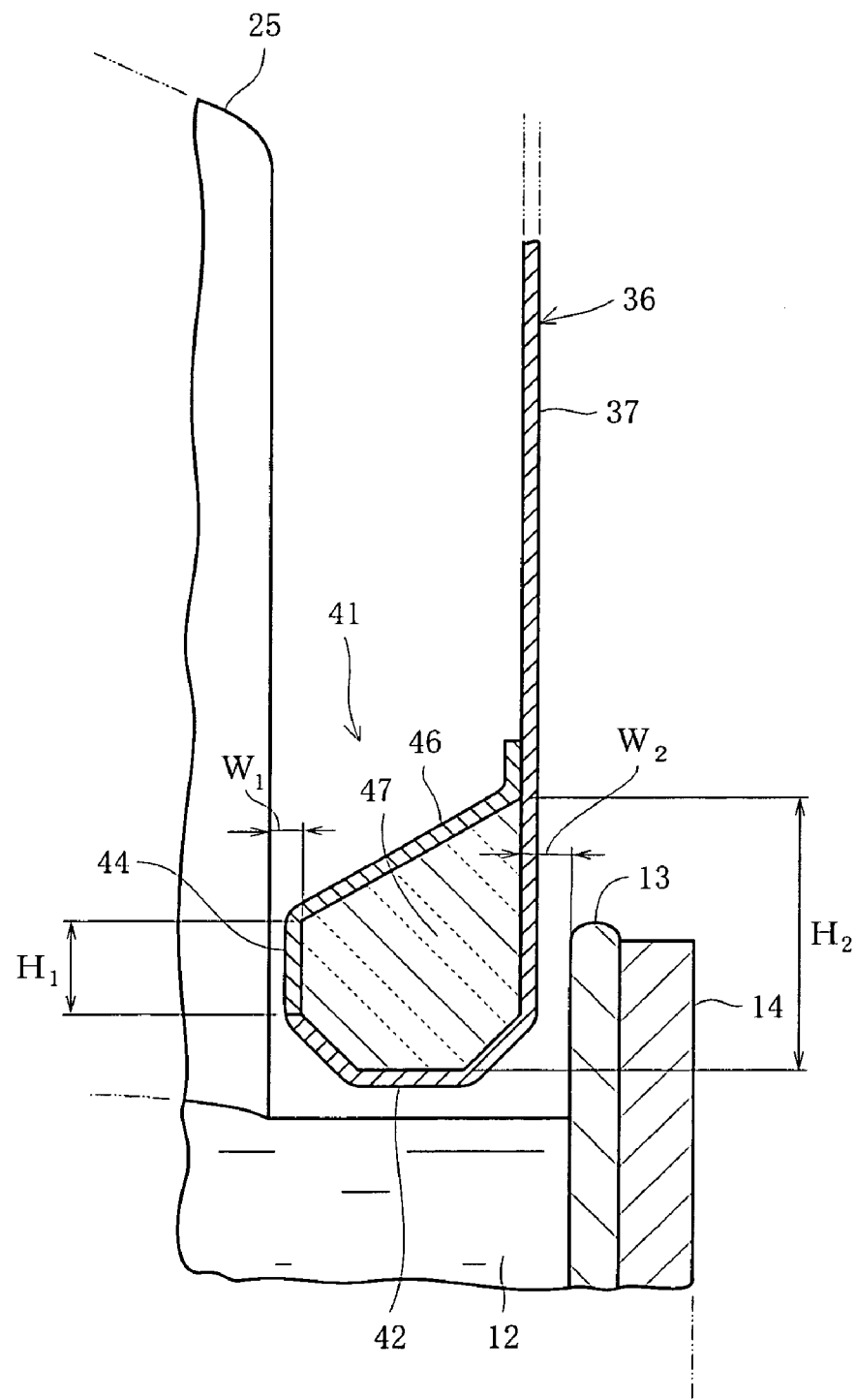
FIG. 5 is a sectional view showing the heat shielding member which has a heat accumulating member whose section is a hexagonal shape.
Figure 6:
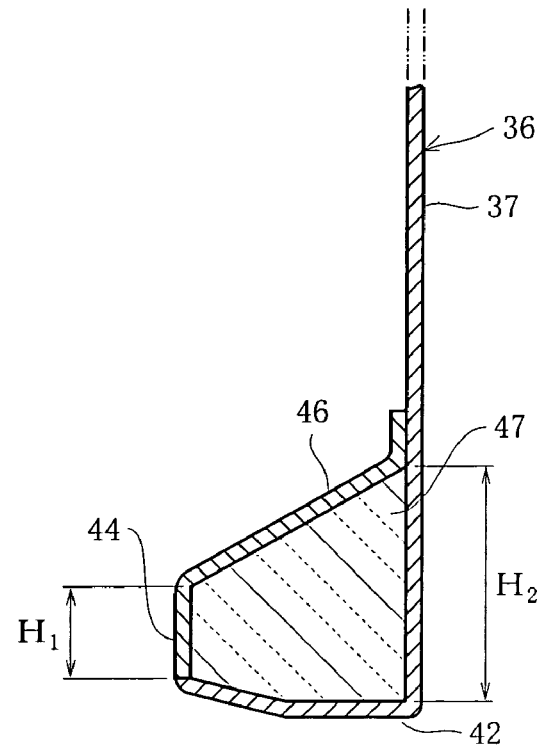
FIG. 6 is a sectional view showing the heat shielding member which has a heat accumulating member whose section is a pentagonal shape.
Figure 7:
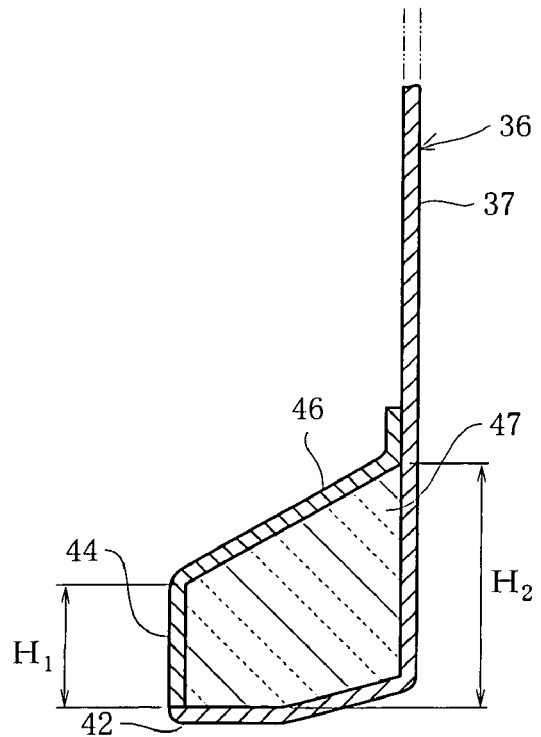
FIG. 7 is a sectional view showing another heat shielding member which has a heat accumulating member whose section is a pentagonal shape.
Figure 8:
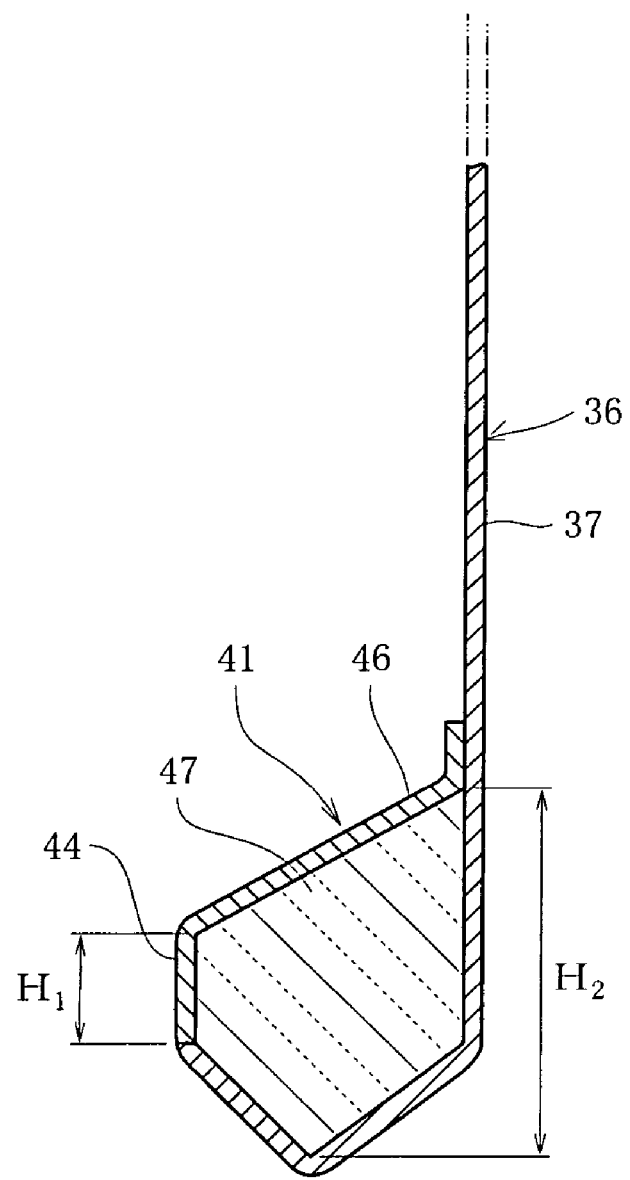
FIG. 8 is a sectional view showing further another heat shielding member which has a heat accumulating member whose section is a pentagonal shape.

Further, in the above-mentioned embodiment, the heat accumulating member 47 with the section of a tetragonal shape is shown by the swelling portion 41 which is composed of the vertical wall 44, the bottom wall 42 and the upper wall 46, but as shown in FIG. 5, the heat accumulating member 47 may be the section of a hexagonal shape, and as shown in FIGS. 6 to 8, it may be the section of a pentagonal shape. Even if the section is a pentagonal shape and a hexagonal shape, the surrounding of the silicon single crystal rod 25 nearby the silicon melt at the lower side than the swelling portion 41 is positively heated by the heater 18 and the silicon melt 12 at high temperature and the abrupt lowering of temperature at the outer peripheral portion of the silicon single crystal rod 25 can be intercepted so far as the height $H_1$ of the inner peripheral face of the heat accumulating portion 47 is 10 mm or more and d/2 or less and the minimum distance $W_1$ with the outer peripheral face of the silicon single crystal rod 25 is 10 mm or more and 0.2 d or less.

Figure 9:
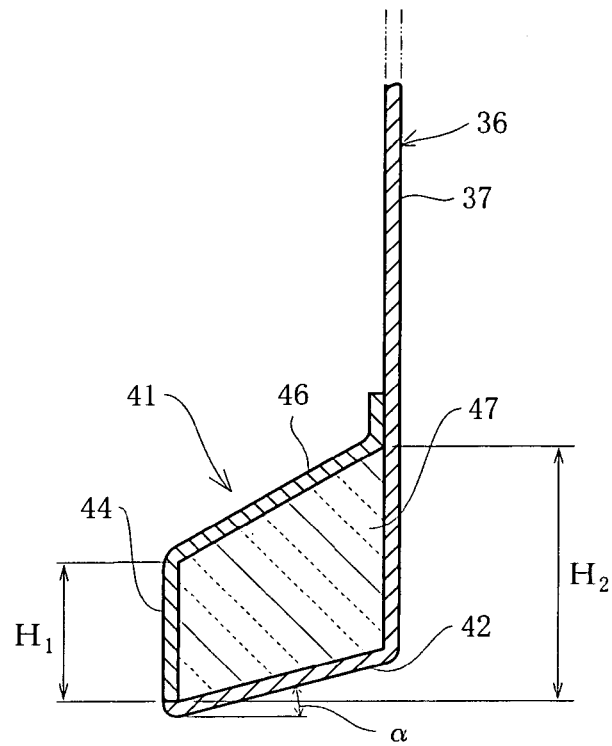
FIG. 9 is a sectional view showing the heat shielding member in which the diameter of the bottom face of a heat accumulating member is formed so as to be small in accordance with facing downward.
Figure 10:
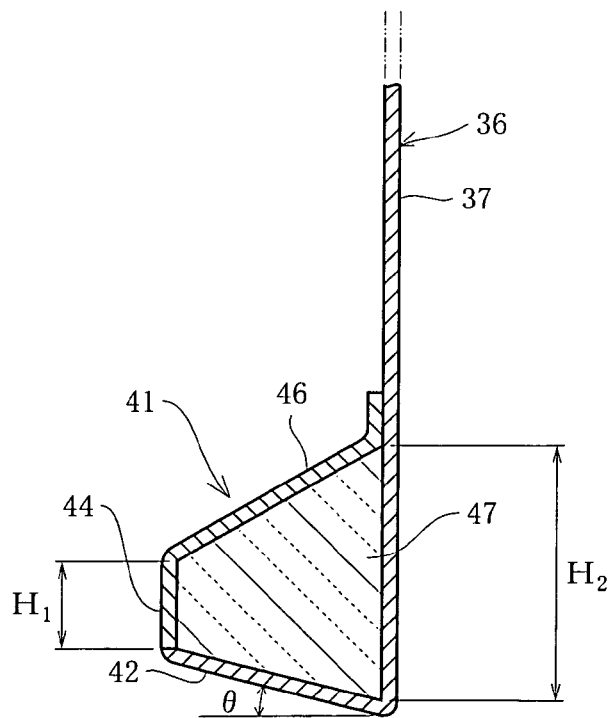
FIG. 10 is a sectional view showing the heat shielding member in which the diameter of the bottom face of a heat accumulating member is formed so as to be small in accordance with facing upward.

Further, in the above-mentioned embodiment, the bottom face which is horizontal to the heat accumulating member 47 is formed, but as shown in FIGS. 9 and 10, the heat accumulating member 47 may have the bottom face which is formed so that its diameter is lessened at an angle ($\alpha$ or $\theta$) exceeding zero degree and being 80 degrees or less against a plane in accordance with facing downward or upward so far as the height $H_1$ of the inner peripheral face of the heat accumulating portion 47 is 10 mm or more and d/2 or less and the minimum distance $W_1$ with the outer peripheral face of the silicon single crystal rod 25 is 10 mm or more and 0.2 d or less. Also in the heat shielding member, the surrounding of the silicon single crystal rod 25 nearby the silicon melt at the lower side than the swelling portion 41 is positively heated by the heater 18 and the silicon melt 12 at high temperature and the abrupt lowering of temperature at the outer peripheral portion of the silicon single crystal rod 25 can be intercepted.

INDUSTRIAL APPLICABILITY

The heat shielding member of the silicon single crystal pulling-up device of the present invention can nearly homogenize the distribution of temperature gradient to a diameter direction in the axial direction of the silicon single crystal rod and can produce a silicon single crystal rod without faults by the model of Voronkov.

The invention claimed is:

1. A heat shielding member of a silicon single crystal pulling-up device which is provided in a device which pulls up a silicon single crystal rod (25) from a silicon melt (12) which is stored in a quartz crucible (13) which is heated by a heater (18) surrounding the outer peripheral face of the quartz crucible (13) and equipped with a tube portion (37) whose lower end is situated upward at an interval from the surface of the silicon melt (12) and which shields radiant heat from the heater (18) surrounding the outer peripheral face of the silicon single crystal rod (25), a swelling portion (41) which is provided at the lower portion of the tube portion (37) by being swollen to a tube direction, and a ring-shape heat accumulating portion (47) which is provided at the inside of the swelling portion (41) and surrounds the outer peripheral face of the lower portion of the silicon single crystal rod (25) and the diameter (d) of the silicon single crystal rod (25) is 100 mm or more, wherein the heat accumulating portion (47) consisting essentially of alumina, having a thermal conductivity of 5 W/(m·° C.) or less, and the heat accumulating portion (47) has an inner peripheral face which is in parallel to the axial line of the silicon single crystal rod (25), or is slanted at an angle of −30 degrees or more and +30 degrees or less and is formed so that the inner peripheral face of the heat accumulating portion (47) is a height ($H_1$) of 10 mm or more and d/2 or less, and the minimum distance ($W_1$) between the outer peripheral face of the silicon single crystal rod (25) and the inner peripheral face of the heat accumulating portion (47) is 10 mm or more and 0.2 d or less.

2. The heat shielding member of a silicon single crystal pulling-up device according to claim 1, wherein the heat accumulating portion (47) has an outer peripheral face which is in parallel to the axial line of the silicon single crystal rod (25), or is slanted at an angle of −30 degrees or more and +30 degrees or less, a vertical distance ($H_2$) between the upper rim of the outer peripheral face and the lowest portion of the heat accumulating portion (47) is 10 mm or more and d or less, and the minimum distance ($W_2$) between the inner peripheral face of the quartz crucible (13) and the outer peripheral face of the heat accumulating portion (47) is 20 mm or more and d/4 or less.

3. The heat shielding member of a silicon single crystal pulling-up device according to claim 2, wherein the tube portion (37) has an inner tube member (37a), an outer tube member (37b) and an adiabatic material (37c) which is filled or intervened between the inner tube member (37a) and the outer tube member (37b).

4. The heat shielding member of a silicon single crystal pulling-up device according to claim 3, wherein the inner diameter ($D_1$) of an adiabatic material (37c) is 2d or more and the thickness (t) of the adiabatic material (37c) is 5 mm or more.

5. The heat shielding member of a silicon single crystal pulling-up device according to claim 4, wherein the inner diameter ($D_2$) of an inner tube member (37a) is (2d−2n) or more when the thickness of the inner tube member (37a) is n.

6. The heat shielding member of a silicon single crystal pulling-up device according to claim 1, wherein the heat accumulating portion (47) has an upper face whose diameter is largely formed at an angle (δ) exceeding zero degree and being 80 degrees or less against the upper face which is horizontally formed or a horizontal plane in accordance with facing upward.

7. The heat shielding member of a silicon single crystal pulling-up device according to claim 6, wherein the tube portion (37) has an inner tube member (37a), an outer tube member (37b) and an adiabatic material (37c) which is filled or intervened between the inner tube member (37a) and the outer tube member (37b).

8. The heat shielding member of a silicon single crystal pulling-up device according to claim 7, wherein the inner diameter ($D_1$) of an adiabatic material (37c) is 2d or more and the thickness (t) of the adiabatic material (37c) is 5 mm or more.

9. The heat shielding member of a silicon single crystal pulling-up device according to claim 8, wherein the inner diameter ($D_2$) of an inner tube member (37a) is (2d−2n) or more when the thickness of the inner tube member (37a) is n.

10. The heat shielding member of a silicon single crystal pulling-up device according to claim 1, wherein the heat accumulating portion (47) has a bottom face which is horizontally formed.

11. The heat shielding member of a silicon single crystal pulling-up device according to claim 10, wherein the tube portion (37) has an inner tube member (37a), an outer tube member (37b) and an adiabatic material (37c) which is filled or intervened between the inner tube member (37a) and the outer tube member (37b).

12. The heat shielding member of a silicon single crystal pulling-up device according to claim 11, wherein the inner diameter ($D_1$) of an adiabatic material (37c) is 2d or more and the thickness (t) of the adiabatic material (37c) is 5 mm or more.

13. The heat shielding member of a silicon single crystal pulling-up device according to claim 12, wherein the inner diameter ($D_2$) of an inner tube member (37a) is (2d−2n) or more when the thickness of the inner tube member (37a) is n.

14. The heat shielding member of a silicon single crystal pulling-up device according to claim 1, wherein the heat accumulating portion (47) has a bottom face whose diameter is formed so as to be lessened at an angle (α or θ) exceeding zero degree and being 80 degrees or less against a plane in accordance with facing downward or upward.

15. The heat shielding member of a silicon single crystal pulling-up device according to claim 14, wherein the tube portion (37) has an inner tube member (37a), an outer tube member (37b) and an adiabatic material (37c) which is filled or intervened between the inner tube member (37a) and the outer tube member (37b).

16. The heat shielding member of a silicon single crystal pulling-up device according to claim 15, wherein the inner diameter ($D_1$) of an adiabatic material (37c) is 2d or more and the thickness (t) of the adiabatic material (37c) is 5 mm or more.

17. The heat shielding member of a silicon single crystal pulling-up device according to claim 16, wherein the inner diameter ($D_2$) of an inner tube member (37a) is (2d−2n) or more when the thickness of the inner tube member (37a) is n.

* * * * *